United States Patent [19]

Hurd

[11] Patent Number: 5,111,819

[45] Date of Patent: May 12, 1992

[54] NMR IMAGING OF METABOLITES USING A MULTIPLE QUANTUM EXCITATION SEQUENCE

[75] Inventor: Ralph E. Hurd, Milpitas, Calif.

[73] Assignee: General Electric, Milwaukee, Wis.

[21] Appl. No.: 276,173

[22] Filed: Nov. 25, 1988

[51] Int. Cl.$^5$ ............................................. A61B 5/055
[52] U.S. Cl. .................................. 128/653.2; 324/309
[58] Field of Search ........................... 128/653, 653.2; 324/311, 309, 312

[56] References Cited

U.S. PATENT DOCUMENTS

| | | | |
|---|---|---|---|
| 4,684,893 | 8/1987 | Kojima et al. | 324/312 |
| 4,703,270 | 10/1987 | Hall et al. | 324/309 |
| 4,728,889 | 3/1988 | Gadian et al. | 324/311 |
| 4,739,266 | 4/1988 | Kunz | 324/309 |
| 4,774,466 | 9/1988 | Satlin | 324/309 |
| 4,774,467 | 9/1988 | Sorenson | 324/311 |
| 4,843,321 | 6/1989 | Sotak | 324/309 |

FOREIGN PATENT DOCUMENTS

| | | | |
|---|---|---|---|
| 0146140 | 8/1985 | Japan | 128/653 A |
| 0005201 | 9/1987 | PCT Int'l Appl. | 128/653 A |

OTHER PUBLICATIONS

Dumoulin, Charles L., *The Application of Multiple-Quantum Techniques...*, Journal of Magnetic Resonance, 64, 38–46 (1985).

Frahm, Jens et al., *Localized Proton Spectroscopy Using Stimulated Echoes*, Journal of Magnetic Resonance 72, 502–508 (1987).

"Solvent Suppression in Fourier Transform Nuclear Magnetic Resonance", P. J. Hore, Jour. Mag. Res. 55, pp. 283–300 (1983).

"Uniform Excitation of Multiple-Quantum Coherence: Application to Multiple Quantum Filtering", O. W. Sorensen et al., Jour. Mag. Res. 55, pp. 104–113 (1983).

Primary Examiner—Lee S. Cohen
Attorney, Agent, or Firm—Quarles & Brady

[57] ABSTRACT

A multiple quantum excitation pulse sequence for producing NMR signals is optimized for reconstructing images of the distribution and levels of metabolites in vivo using magnetic field gradients. Unwanted signals from water are reduced by application of composite magnetic field gradients, unwanted signals from lipids are reduced by use of a frequency selective pulse optimized to null the lipid signals, and the signal-to-noise ratio of the signals produced by lactate are enhanced by the addition of two 180° excitation pulses to the sequence.

8 Claims, 4 Drawing Sheets

NMR IMAGING OF METABOLITES USING A MULTIPLE QUANTUM EXCITATION SEQUENCE

BACKGROUND OF THE INVENTION

The field of the invention is nuclear magnetic resonance (NMR) imaging and, more particularly, methods for removing unwanted spin resonance response signals from an NMR signal.

It is well known that nuclear magnetic resonance (NMR) signals produced by hydrogen nuclei ($^1$H) provide a useful tool for monitoring human metabolism. However, it is also well known that $^1$H NMR signals suffer from unwanted signal components such as those from uncoupled spin resonances, such as water and coupled-spin resonances, such as those from lipids. These undesired spin resonances are typically three to four orders of magnitude larger than the spectral peaks of interest. Further, these undesired spin resonances are positioned approximately at the same spectral position as the desired metabolite peaks, rendering the detection of the desired metabolite peaks virtually impossible by conventional NMR techniques. Accordingly, it is highly advantageous to provide a method for acquiring spin resonance responses from coupled hydrogen spins in metabolites in the presence of other in vivo human tissue components such as water and lipids.

Several NMR methods have been proposed which utilize a narrow bandwidth RF excitation pulse which is centered at the frequency of the offending spectral peak, and which suppresses the unwanted resonance peak in the total acquired NMR response spectrum. The most straightforward approach is the application of a long presaturating RF excitation pulse utilized to suppress the offending signal peak response (usually that of a water resonance) prior to receiving and processing the desired spectrum Another technique utilizes a series of 90°, RF excitation pulses with interleaved delays, to maneuver the undesired spin magnetization into a longitudinal direction, while the spin magnetization of the desired resonances are maneuvered into the transverse plane where they produce a detectable NMR signal. These techniques are limited because they also suppress desired spin resonant components which are at or near the frequency of the suppressed component, and they do not suppress other undesired spin resonant components at other frequencies.

Still other techniques are known which discriminate against the water resonance peak by taking advantage of the differences in the spin-lattice relaxation time $T_1$ and the spin-spin relaxation time $T_2$ between the undesired water spins and other chemical spins. Thus, long echo times can be effectively utilized to suppress the water peak in some tissues, while leaving other resonances, such as that of lactate, substantially unaffected. Many of the undesirable lipid resonances are also affected by this technique and are attenuated in the acquired NMR signal.

Other methods utilize an inverting pulse, having a delay equal to the null time constant ($T_{null}$) of the undesired spin component (water), prior to readout. While suppressing the later resonance, these methods also partially suppress the desired metabolite resonance peaks and do not, in general, suppress other undesired (lipid) spin resonances.

Several existing methods suppress unwanted NMR response signals produced by uncoupled spin resonances by utilizing the scalar coupling which exists between adjacent atoms of the same molecule. The spins are nutated into the transverse plane and are acted upon by a sequence of RF excitation pulses and delays which cause the spin magnetization produced by the desired coupled atoms to evolve in a manner different from the manner in which spin magnetizations produced by the uncoupled spins evolve. Some such techniques, such as the Homonuclear Polarization Transfer technique, use a nonselective 90° RF excitation pulse and a delay to invert the phase of all coupled spins having a particular coupling constant J. Such methods cannot, however, suppress lipid resonances which are coupled to one another. This disadvantage may be overcome with yet another method known as Homonuclear Double-Resonance Difference Spectroscopy, which allows retention of certain coupled peaks, such as the lactate resonance, while excluding certain other resonances, such as the lipid alkyl resonances. This method applies a selective 180° RF excitation pulse which is centered on one of the lactate peak frequencies to only invert the phase of the lactate resonance peak, to which the first resonance peak is coupled. This occurs only if the frequency of the selective pulse is correctly set to within about 1 Hz, and an incorrect frequency will cause the original lactate, peak to be distorted in phase or amplitude, and may result in the desired signal components cancelling one another in the final NMR signal.

In a co-pending U.S. patent application Ser. No. 181,956 entitled "Method For Volume Localized Spectral Editing of NMR Signals Produced By Metabolites Containing Coupled Spins", a pulse sequence is described in which the signal components produced by the metabolite molecules of interest are amplitude modulated as a function of the time period, $t_1$, between two of its RF excitation field pulses. By conducting two such pulse sequences with different time periods, and subtracting the resulting NMR signals, the desired signal components are produced while unmodulated signal components from water and lipids are suppressed.

In another co-pending U.S. patent application Ser. No. 215,979 entitled "Two-Dimensional Method For Spectral Editing of NMR Signals Produced By Metabolites Containing Coupled Spins", a technique is described in which a series of pulse sequences are run and a time period ($t_1$) between two of its RF excitation field pulses is incremented through a range of values. An array of NMR data is acquired and a two-dimensional Fourier transform is performed to produce a contour map, or graph, of chemical shift spectral components versus the zero quantum modulation frequency components.

While these two prior methods are satisfactory for NMR spectroscopy, they are unacceptable for direct conversion to an NMR imaging method. Unfortunately, when these methods are used to produce images, the levels of both water and lipid suppression are not sufficient when frequency encoding is used in the imaging sequence, and the signal-to-noise ratio is marginal.

SUMMARY OF THE INVENTION

The present invention relates to an NMR pulse sequence which employs a double quantum coherence transfer technique to produce an image of the distribution and levels of metabolites in vivo. More specifically, the pulse sequence includes a set of three RF excitation pulses which are applied to the region of interest in the presence of a polarizing magnetic field and in the presence of a composite magnetic field gradient to produce a multiple quantum excitation of $^1H$ in the region of interest, applying a 180° RF excitation pulse following the multiple quantum excitation, and applying magnetic field gradients to the region of interest after the multiple quantum excitation to position encode the NMR signals which result. By applying composite (i.e. simultaneous x, y and z) gradients during the multiple quantum excitation, the signal components due to water are substantially reduced. In addition, the 180° excitation pulse substantially improves the signal-to-noise ratio of the signal components due to the methyl portion of the lactate molecule.

Yet another aspect of the invention is to further suppress the signal components due to lipids by replacing the third excitation pulse in the multiple quantum excitation with a frequency selective excitation pulse which is optimized to reduce the lipid signal components in the resulting NMR signals.

A general object of the invention is to adapt the multiple quantum excitation sequence to an imaging sequence which may be employed to produce images of the distribution and levels of metabolites in vivo. The time period $t_1$ between the second and third excitation pulse is incremented through a series of discrete values to provide discrimination between metabolite signals and lipid signals. Residual water signals are suppressed by the applied composite magnetic field gradients, the residual lipid signals are suppressed by the frequency selective third excitation pulse, and the desired lactate signals are enhanced by the application of the 180° excitation pulse and the application of the selective third excitation pulse. A variety of known imaging methods can then be employed by applying magnetic field gradients to the excited spin to encode the resulting NMR signals. The encoded NMR signals are employed to reconstruct an image using well known reconstruction algorithms.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIG. 1b is a graphic representation of the spectral components produced by the lactate molecule of FIG. 1a;

DETAILED DESCRIPTION OF THE INVENTION

Figure 1A:
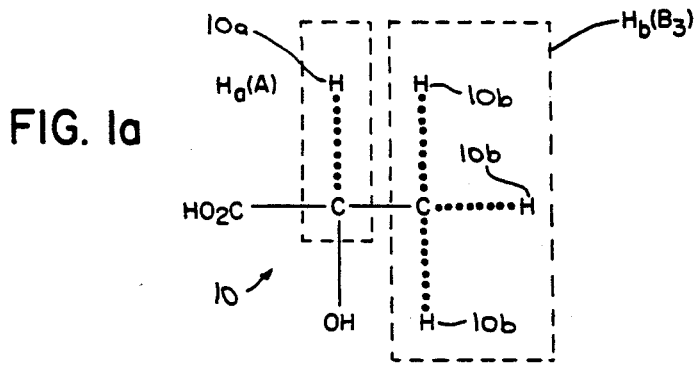
FIG. 1a is a schematic representation of a lactate molecule which produces an NMR signal having a number of spectral components.

Referring initially to FIG. 1a, a molecule 10 from which NMR information is to be obtained is illustrated. Molecule 10 is a type $AB_3$ molecule, such as a lactate molecule, in which scalar coupling exists between a single hydrogen atom 10a, having a single bond with a middle carbon atom in the Ha(A) moiety, and the three hydrogen atoms 10b, each having a bond with an end carbon atom in the Hb($B_3$) moiety. When this molecule is subjected to a polarizing magnetic field $B_0$ and a transverse RF excitation field $B_1$ is applied, an NMR signal is produced by this molecule which has a number of resonant peaks.

Since the Ha(A) hydrogen atom 10a can have the spin of its nucleus pointing either up or down, the nuclear spins of the Hb($B_3$) atoms 10b encounter one of two different local environments, so that the peak of their resonance is split into a doublet of spectral lines, each of a substantially similar amplitude. Similarly, the three b hydrogen atoms 10b can assume spin configurations with any one of: all three spins pointing in the upward direction, one spin in the downward direction and the other two spins in the upward direction, two spins in the downward direction and one spin in the upward direction, or all three spins in the downward direction. Therefore, the a hydrogen atom 10a sees four different environments and its resonance is split into a quartet of spectral lines, having relative intensities 1:3:3:1.

Figure 1B:
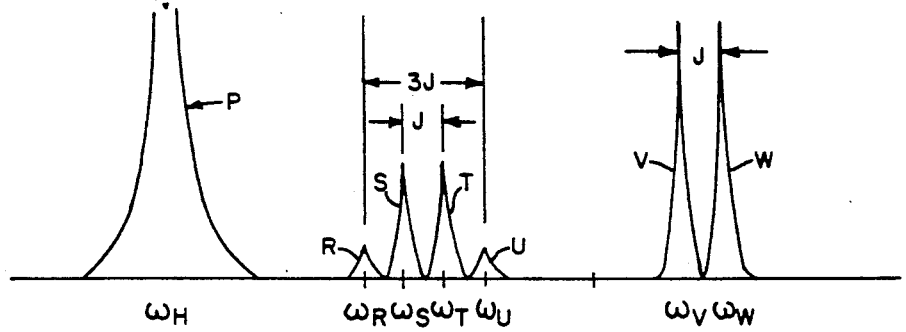

An example of the transformed NMR signal produced by the in vivo lactate molecule is shown in FIG. 1b. The NMR signal has been converted to the frequency domain such that its signal components are shown as peaks, or "spectral components", at different frequencies along the horizontal frequency axis. One spectral component produced by the hydrogen nuclei in the water is shown at the frequency $\omega_H$, although it can be appreciated by those skilled in the art that there are typically many other unwanted spectral components present which are produced by uncoupled resonant spin. These other spectral components are often many orders of magnitude greater than the lactate spectral components.

The NMR signal components due to the a hydrogen spin resonance Ha(A) of the illustrative lactate molecule 10 provides the quartet of spectral components R, S, T and U at respective frequencies $\omega_R$, $\omega_S$, $\omega_T$ and $\omega_U$. Each of these peaks are separated by the spin-spin coupling constant J which is approximately 7.3 Hz at 2.0 Tesla. The b hydrogen resonances Hb($B_3$) provide the doublet spectral components V and W, at respective frequencies $\omega_V$ and $\omega_W$. The separation therebetween is determined by the same spin-spin coupling constant J. The sum of the frequency offsets from the RF transmitter for the two coupled protons ($H_a$ and $H_b$) defines the double quantum modulation frequency (DQMF). If the RF transmitter is set at the frequency of one of these coupled protons, then the DQMF becomes the frequency offset between the two coupled protons which is 250 Hz at a field strength of 2.0 Tesla. The spacing between the center of the quartet and the center of the doublet is referred to as the chemical shift difference. The zero quantum modulation frequency (ZQMF) is equal to this difference in absolute frequency units (HZ). In the example, the ZQMF is equal to 250 Hz at 2.0 Tesla. It will be seen that the relatively huge amplitude of the uncoupled spin resonance component P, as well as the resonance components due to noncoupled lipids, dwarfs the much smaller amplitudes of the desired coupled spin spectral components R-W, so that any attempt to acquire the coupled spin spectral components directly is exceedingly difficult, if not impossible. The zero quantum excitation sequences described in the above-cited co-pending patent applications are methods for separating unwanted spectral components to provide a usable spectrum of components R, S, T, U, V or W.

Figure 2:
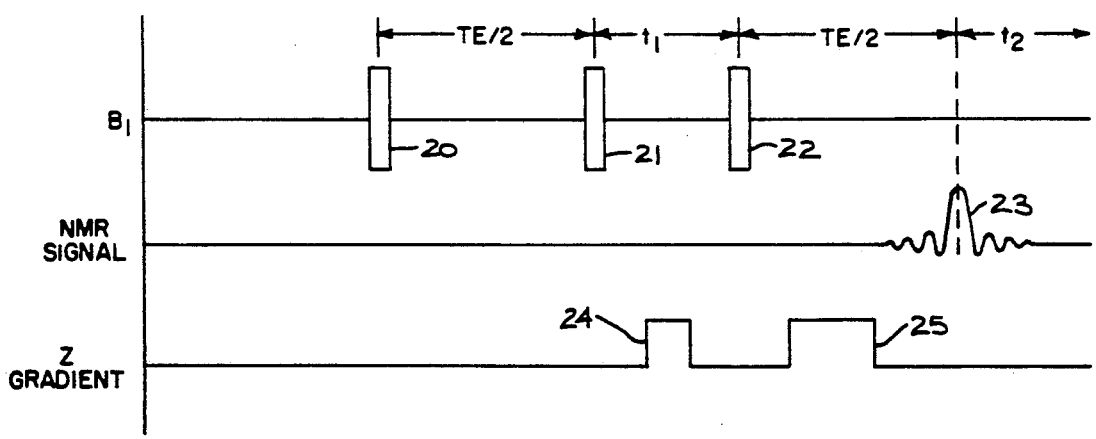
FIG. 2 is a graphic representation of the prior art, multiple quantum excitation pulse sequence employed in an NMR spectrometer.

The multiple quantum excitation pulse sequence is illustrated in FIG. 2. It includes the application of three 90° RF excitation pulses 20, 21 and 22, and the acquisition of the resulting NMR echo signal 23. The RF excitation transmitter frequency is positioned on the water resonance at 4.8 parts per millions. A gradient pulse 24 is applied during the time period $t_1$ to dephase the spin, and a second magnetic field gradient pulse 25 is applied after the third RF excitation pulse 22. The strength of the pulse 25 is double that of the pulse 24 to selectively rephase the spin as discussed by A. Bax, P. G. deJong, A. F. Mehlkopf and J. Smidt in *Chem. Phys. Lett.* 69, 576 (1980). As a result, the NMR echo signal 23 is produced during an acquisition period.

The multiple quantum excitation pulse sequence is a sequence in which the first pair of selective 90° RF pulses separated by the delay (TE/2) create multiple quantum coherence of the spin populations in the localized NMR spin system. This coherence of the spin populations evolves during the subsequent time period ($t_1$) and with coupled spins this results in the phase modulation of the detected NMR signal. Spin resonances which are not coupled to other spin resonances (as is the case with water and part of lipid signal) do not exhibit multiple quantum behavior and do not, therefore, experience modulation during the time period ($t_1$). In addition, spin resonances which are coupled exhibit unique multiple quantum modulation frequencies and this difference can be exploited to distinguish between coupled spin resonances. The present invention enables this phenomena to be used in the production of NMR images.

Figure 3:
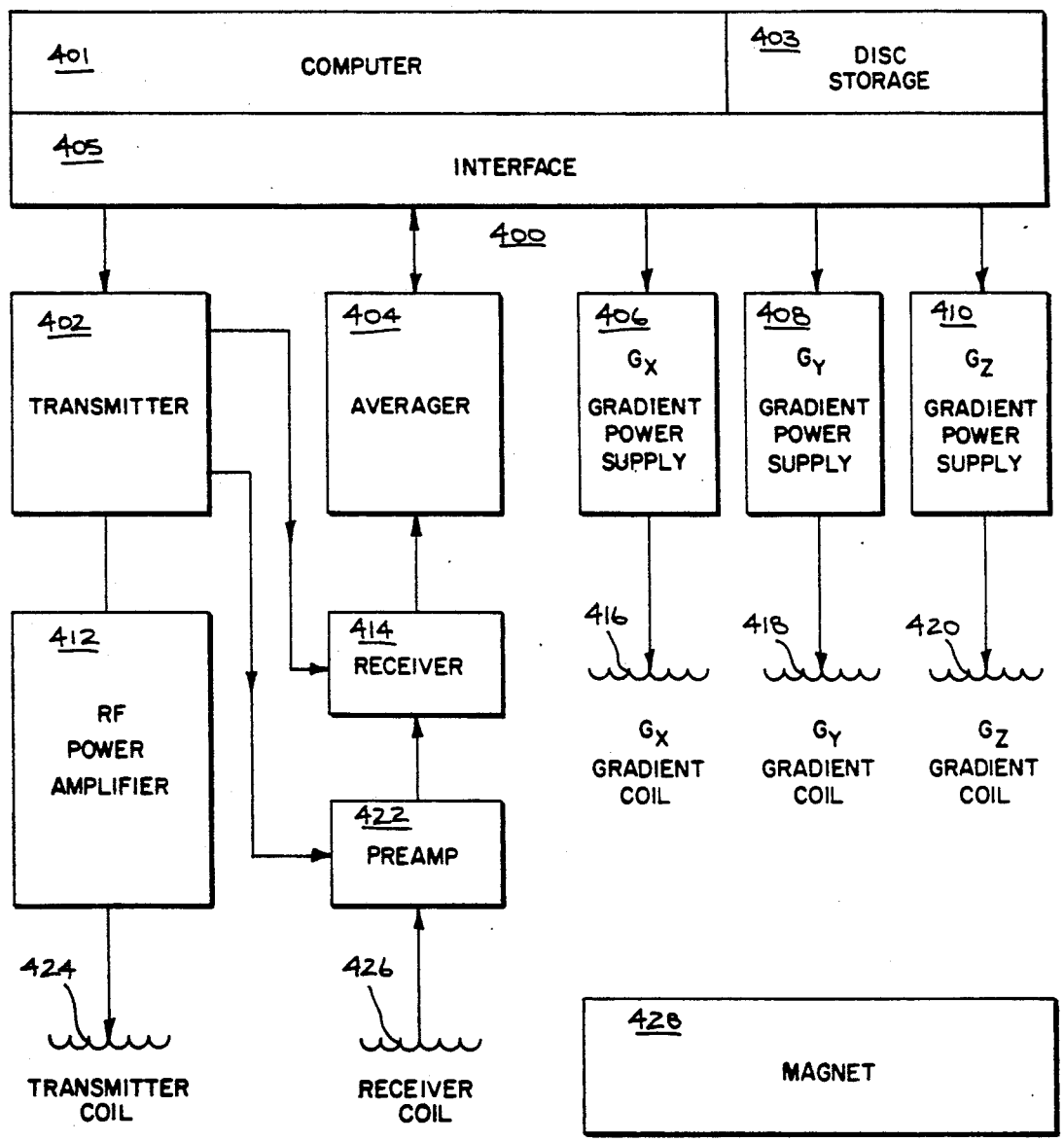
FIG. 3 is a simplified schematic diagram of the NMR system which employs the present invention.

FIG. 3 is a simplified block diagram of the major components of an NMR system suitable for acquiring the data according to the present invention. The system, generally designated 400, is made up of a general purpose minicomputer 401 which is functionally coupled to disk storage unit 403 and an interface unit 405. An RF transmitter 402, signal averager 404, and gradient power supplies 406, 408 and 410 for energizing, respectively, $G_x$, $G_y$ and $G_z$ gradient coils 416, 418, and 420, are coupled to computer 401 through interface unit 405.

RF transmitter 402 contains an RF oscillator oscillating at the desired Larmor frequency. The transmitter is gated with pulse envelopes from computer 401 to generate RF pulses having the required modulation to excite resonance in the object under study. The RF pulses are amplified in RF power amplifier 412 to levels varying from 100 watts to several kilowatts and applied to transmitter coil 424.

The NMR signal is sensed by receiver coil 426, amplified in a low noise preamplifier 422, and applied for further amplification, detection, and filtering to receiver 414. The signal is then digitized for averaging by signal averager 404 and for processing by computer 401. Preamplifier 422 and receiver 414 are protected from the RF pulses during transmission by active gating or by passive filtering.

Computer 401 provides gating and envelope modulation for NMR pulses, blanking for the preamplifier and RF power amplifier, and voltage waveforms for the gradient power supplies. It also advances the gradients and the frequency of RF pulses during scanning. The computer also performs data processing such as Fourier transforms, data filtering, and storage functions.

The transmitter and receiver RF coils, if desired, may comprise a single coil. Alternatively, two separate coils that are electrically orthogonal may be used. The latter configuration has the advantage of reduced RF pulse breakthrough into the receiver during pulse transmission. In both cases, the fields of coils are orthogonal to the direction of the static magnetic field $B_0$ produced by magnet (FIG. 3). The coils are isolated from the remainder of the system by enclosure in an RF shielded case.

Magnetic field gradient coils 416, 418, and 420 (FIG. 3) are necessary to provide gradients $G_x$, $G_y$ and $G_z$, respectively. In the NMR pulse sequences described herein, the gradients should be monotonic and linear over the region of interest. Non-monotonic gradient fields cause a degradation in the NMR signal data, known as aliasing, which leads to severe artifacts. Non-linear gradients cause geometric distortions of the image.

Figure 4:
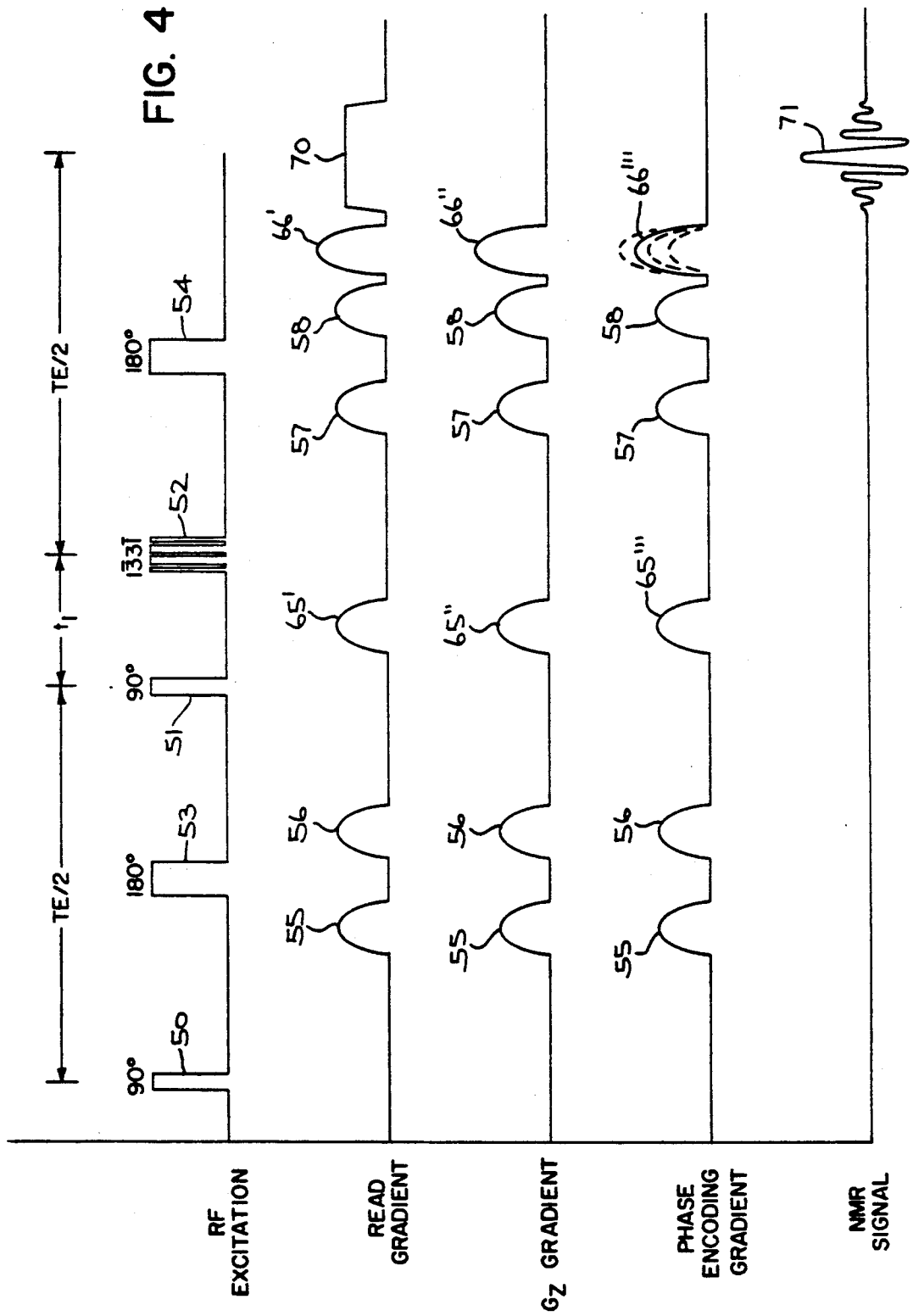
FIG. 4 is a graphic representation of the preferred embodiment of the pulse sequence used to practice the present invention.

The present invention is an improvement to the pulse sequence of FIG. 2 which enables the NMR system of FIG. 3 to produce images of the distribution and level of metabolites in vivo. The preferred embodiment of the improved pulse sequence is shown in FIG. 4. As with the conventional multiple quantum coherence pulse sequence, it includes a first pair of 90° RF excitation pulses 50 and 51 which define the time period TE/2. The third 90° pulse 52 which defines the time period $t_1$ is a selective RF excitation pulse which is known in the art as a $1\bar{3}3\bar{1}$ pulse. As will be explained in more detail below, this selective excitation pulse 52 further suppresses the signal component from lipids and it enhances the signal-to-noise ratio of the methyl ($CH_3$) component by a factor of three. A pair of 180° RF refocusing pulses 53 and 54 are inserted in the middle of the respective TE/2 periods to improve the transfer efficiency by reducing chemical shift precession and to thereby improve the signal-to-noise ratio of the methyl ($CH_3$) signal component.

To remove spurious signals generated by anomalies in the $B_1$ excitation field produced by the RF refocusing pulses 53 and 54, a pair of composite gradient magnetic field pulses straddle each refocusing pulse 53 and 54. More specifically, these include composite pulse pair 55 and 56, which are produced along each of the three axes of the applied magnetic field gradient, and which straddle the first refocusing pulse 53. They also include composite pulse pair 57 and 58 which straddles the second refocusing pulse 54 and which produces magnetic field gradient components along each axis of the NMR system. While these composite gradient magnetic field pulses are not absolutely necessary for proper operation, they do improve signal quality by preventing interference from unwanted echoes which might be formed as a result of imperfect refocusing pulses.

The most dramatic improvement in signal quality is achieved by the use of a selective excitation pulse 52 at the culmination of the $t_1$ time period. When the multiple quantum excitation pulse sequence is used for in vivo measurements, the residual lipid signal often remains quite large relative to the metabolites of interest. This can result in unwanted background signal from "Fourier bleed" of the lipid double quantum frequencies when the NMR signal is processed to produce an image using a Fourier transformation method. This unwanted lipid signal can be significantly reduced by causing selective coherence transfer from the CH of the lactate molecule to the CH$_3$ of the lactate molecule during the final TE/2 period. This is achieved with the selective $1\bar{3}3\bar{1}$ RF pulse 52.

Figure 5:
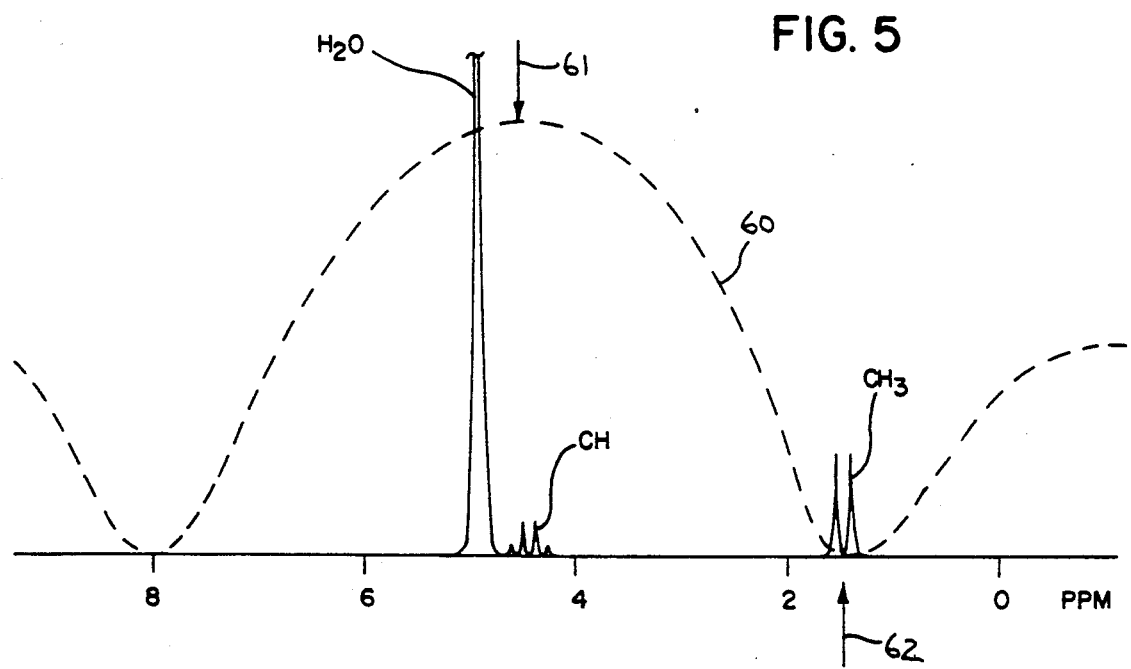
FIG. 5 is a graphic representation of the frequency selective excitation pulse employed in the sequence of FIG. 4.

Referring particularly to FIG. 5, the $1\bar{3}3\bar{1}$ pulse 52 has an excitation spectrum which is indicated by the dashed line 60. The selective pulse 52 is tuned for maximum excitation of the CH component of lactate molecule at 4.2 parts per million (PPM), as indicated by arrow 61. It has a null at the chemical shift frequency of the methyl (CH$_3$) component of the lactate molecule, as indicated by arrow 62. The expression for this selective RF excitation pulse 52 is as follows:

$$S_n(\omega) = \sin^n(\omega\tau/2)$$

where:
$\omega = 2$ (frequency difference between CH$_3$ and CH resonances = 500 Hz)
$n = 4$
$I = 2$ milliseconds A complete discussion of the $1\bar{3}3\bar{1}$ selective pulse and other similar pulses is provided by P. J. Hore in his article "Solvent Suppression in Fourier Transform Nuclear Magnetic Resonance" which appeared in *Journal of Magnetic Resonance* 55, pp. 283-300 (1983).

Referring again to FIG. 4, still another aspect of the present invention is the use of composite magnetic field gradient pulses 65 during the $t_1$ time period of the multiple quantum excitation pulse sequence in combination with composite magnetic field gradient pulses 66 during the final TE/2 time period. The composite gradient pulses 65 cause the double quantum coherent spin (CH$_3$) to accumulate some phase dispersal ($2\theta$/cm) along the direction determined by the vector sum of the gradient field components 65', 65'' and 65'''. The single quantum coherent spin of the unwanted water protons accumulates a similar phase dispersal, but only one-half as much ($\theta$/cm). Subsequently, during the second TE/2 time period, all of the signal components become single quantum and to refocus the phase of the desired methyl proton signals (CH$_3$) the composite gradient pulse 66 must have double the strength and be oppositely directed ($-2\theta$/cm). While the composite gradient pulse 66 rephases the desired methyl signal (CH$_3$), the undesired water signal is over compensated and is dephased in the opposite direction ($-\theta$/cm). As a result, the desired signal is restored to its maximum amplitude, while the unwanted signal from water is suppressed by dephasing the signals produced by its protons. As used herein, the term "strength" refers to the integral of the magnetic field gradient amplitude over the time period during which it is applied.

The general objective of the present invention is to improve the multiple quantum excitation pulse sequence so that it can be used to produce images of metabolites in vivo. Referring still to FIG. 4, there are numerous imaging techniques which can be used with the pulse sequence and which involve the application of magnetic field gradient pulses during the final TE/2 time period. One such method is illustrated in FIG. 4 in which a read gradient pulse 70 is applied during the acquisition of the NMR signal 71 at the termination of the TE/2 time period to frequency encode the NMR signal for position along the x axis. The amplitude of the gradient field pulse 66''' is also stepped through a series of values and the corresponding series of acquired NMR signals are phase encoded for position along the y axis. The resulting two-dimensional array of acquired NMR data is then used to reconstruct an image in the well known manner.

The present invention is not limited to any particular imaging technique, and other strategies can be employed by applying the proper gradient pulses during the final TE/2 time period. For example, the gradient pulse 66'' may be replaced by a gradient pulse which is aligned with the final 180° RF pulse 54. If the pulse 54 is made frequency selective, a slice through the region of interest perpendicular to the z axis is selected for imaging.

Yet another aspect of the invention is to modulate the acquired NMR data as a function of time period $t_1$. This can be done in a number of ways including the difference method disclosed in the above-cited U.S. patent application Ser. No. 181,956, which requires two pulse sequences with different time periods $t_1$. In addition, the pulse sequence can be repeated many times with incrementally different $t_1$ values for each setting of the magnetic field gradients to produce a three-dimensional array of acquired NMR data. Images can then be reconstructed by Fourier transformation along each of these dimensions, including the $t_1$ dimension.

Regardless of the imaging strategy which is selected, the multiple quantum excitation pulse sequence of the present invention substantially improves image quality. The composite gradient pulses 65 and 66 do not significantly improve the signal-to-noise ratio of the desired methyl signal, but they do significantly suppress the unwanted water signal. The use of the pair of symmetrical 180° RF pulses 53 and 54 results in an improvement of approximately 40% in the signal-to-noise ratio, and the use of the selective RF pulse 53 ($1\bar{3}3\bar{1}$) results in a further improvement in methyl signal-to-noise ratio of approximately 160%.

I claim:

1. A method for producing an NMR image of the distribution and levels of metabolites in vivo, the steps comprising:

applying a polarizing magnetic field to metabolite nuclei in a region of interest;

applying a set of three RF excitation field pulses to the metabolite nuclei to produce a multiple quantum excitation of the metabolite nuclei in the region of interest;

applying magnetic field gradient pulses to the metabolite nuclei after the multiple quantum excitation to dephase the metabolite nuclei as a function of their position in the region of interest and to thereby position encode NMR signals which they produce;

acquiring NMR signals produced by the metabolite nuclei in the region of interest;

reconstructing an image using the acquired NMR signals; and wherein the third of said RF excitation field pulses is a selective excitation pulse which is tuned to enhance the components of the acquired NMR signal which is produced by a methyl component of the metabolite nuclei.

2. The method as recited in claim 1 in which the selective pulse is a $1\bar{3}3\bar{1}$ pulse.

3. The method as recited in claim 1 which further includes:

applying a first composite magnetic field gradient pulse during a time period $t_1$ between the second and third of said three RF excitation pulses to dephase the metabolite nuclei; and applying a second composite magnetic field gradient pulse after the third of said three RF excitation field pulses to rephase the metabolite nuclei by an amount substantially equal to the amount of dephasing caused by the first composite magnetic field gradient pulse.

4. The method as recited in claim 3 which further includes:

applying a first 180° RF excitation field pulse midway between the first two of said three RF excitation field pulses; and applying a second 180° RF excitation field pulse midway between the last of said three RF excitation field pulses and the acquisition of said NMR signals.

5. A method for producing an NMR image of the distribution and levels of metabolites in vivo, the steps comprising:

applying a polarizing magnetic field to metabolite nuclei in a region of interest;

applying a set of three RF excitation field pulses to the metabolite nuclei to produce a multiple quantum excitation of the metabolite nuclei in the region of interest;

applying a first composite magnetic field gradient pulse during a time period $t_1$ between the second and third of said three RF excitation pulses to dephase the metabolite nuclei;

applying a second composite magnetic field gradient pulse after the third of said three RF excitation field pulses to rephase the metabolite nuclei by an amount substantially equal to the amount of dephasing caused by the first composite magnetic field gradient pulse;

applying magnetic field gradient pulses to the metabolite nuclei after the multiple quantum excitation to dephase the metabolite nuclei as a function of their position in the region of interest and to thereby position encode NMR signals which they produce;

acquiring NMR signals produced by the metabolite nuclei in the region of interest; and reconstructing an image using the acquired NMR signals.

6. The method as recited in claim 5 in which the second composite magnetic field gradient pulse has substantially twice the strength of the first composite magnetic field gradient pulse.

7. The method as recited in claim 5 which further includes:

applying a first 180° RF excitation field pulse midway between the first two of said three RF excitation field pulses; and applying a second 180° RF excitation field pulse midway between the last of said three RF excitation field pulses and the acquisition of said NMR signals.

8. A method for producing an NMR image of the distribution and levels of metabolites in vivo, the steps comprising:

(a) applying a polarizing magnetic field to metabolite nuclei in a region of interest;

(b) applying a set of three RF excitation field pulses to the metabolite nuclei to produce a multiple quantum excitation of the metabolite nuclei in the region of interest;

(c) applying a first 180° RF excitation field pulse midway between the first two of said three RF excitation field pulses and a second 180° RF excitation field pulse midway between the last of said three RF excitation field pulses and the acquisition of NMR signals;

(d) applying magnetic field gradient pulses to the metabolite nuclei after the multiple quantum excitation to dephase the metabolite nuclei as a function of their position in the region of interest and to thereby position encode the NMR signals which they produce;

(e) acquiring NMR signals produced by the metabolite nuclei in the region of interest;

(f) repeating steps (a) through (e) with a different value for the time period ($t_1$) between the second and third of said three RF excitation field pulses; and (g) reconstructing an image using the acquired NMR signals by Fourier transforming the acquired NMR signals as a function of the strength of the applied magnetic field gradient pulses and as a function of the length of the time period $t_1$.

* * * * *